(12) United States Patent
Doran et al.

(10) Patent No.: US 6,388,516 B1
(45) Date of Patent: May 14, 2002

(54) PRECISION HIGH SPEED MAGNETIC COIL DRIVER CIRCUIT

(75) Inventors: Samuel K. Doran, Wappingers Falls; William A. Enichen, Poughkeepsie, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/709,093

(22) Filed: Nov. 8, 2000

(51) Int. Cl.[7] .............................. H03F 1/24; H03F 1/36; H03F 3/52
(52) U.S. Cl. .................... 330/99; 327/314; 327/316; 327/325; 327/321; 327/319; 330/100; 330/107; 330/109; 330/289; 330/294
(58) Field of Search ........................... 330/98, 99, 100, 330/107, 109, 289, 294; 327/309, 314, 316, 323, 324, 325, 321, 319

(56) References Cited

U.S. PATENT DOCUMENTS

| | | | | |
|---|---|---|---|---|
| 3,822,408 A | * | 7/1974 | Veranth | 330/99 |
| 3,978,418 A | * | 8/1976 | Louw | 330/23 |
| 4,096,517 A | * | 6/1978 | Hinn | |
| 6,028,487 A | * | 2/2000 | Kakuta et al. | 330/311 |
| 6,084,473 A | * | 7/2000 | Nauta et al. | 330/254 |
| 6,323,729 B1 | * | 11/2001 | Sevenhans | 330/51 |

* cited by examiner

Primary Examiner—Michael B Shingleton
(74) Attorney, Agent, or Firm—Whitham, Curtis & Christofferson, P.C.; Daryl K. Neff

(57) ABSTRACT

Accuracy of correction of offset drift with temperature and noise are corrected in a high voltage, high current amplifier is improved by thermal isolation and/or temperature regulation of another amplifier having greater gain and connected to a different power supply in a closed loop feedback servo system. A clamping network connected to the higher gain amplifier to avoid hard saturation due to transient feedback signals from a reactive load, especially an inductive load, also prevents hard saturation of the high voltage, high current amplifier. An adjustable feedback circuit connected to the higher gain amplifier allows adjustment to obtain critical damping of a second order system and faster response to achieve proportionality of output current to input voltage with an accuracy of very few parts per million error and with minimum settling time.

14 Claims, 3 Drawing Sheets

PRECISION HIGH SPEED MAGNETIC COIL DRIVER CIRCUIT

BACKGROUND OF THE INVENTION

1. Field of the Invention

The present invention generally relates to voltage to current converter circuits suitable for driving high-inductance loads and, more particularly, to high speed, high precision coil drivers for electron beam lithography tools, precision cathode ray tubes and precision positioning systems.

2. Description of the Prior Art

Supplying accurate levels of voltage or current to a reactive load presents substantial difficulty when the rate of voltage or current change is large. This circumstance is present and the difficulty particularly evident in arrangements for precision positioning devices (e.g. translation tables) or electromagnetic deflection of a charged particle beam where the beam must be deflected to impinge on different and often widely separated locations of the target at high speed. High speed of deflection or motion is necessary in cathode ray tubes to avoid luminance artifacts, such as image flickering, from being developed. In electron beam lithography tools, high deflection speed and positional accuracy with very short settling time is necessary to maintain acceptable levels of exposure throughput.

In high resolution lithography applications, charged particle electrostatic deflectors are useful for high speed and small size vector deflectors (e.g. 1–10 MHz and under 50 $\mu$m radius). Electron optical aberrations and deflection voltages increase greatly as the electrostatic deflection range is increased. Also, electrostatic deflection plates can be unreliable because of contamination from hydrocarbon deposits which are an unwanted but unavoidable byproduct of photoresist exposure. Such hydrocarbon deposits can build up over time and form an insulating layer that can be charged by the charged particle beam. This unwanted and unpredictable charge on the contaminated deflection plates can produce undesired and unpredictable deflections.

Therefore, magnetic deflection is generally preferred to electrostatic deflection for slower speed and larger range deflections and are not subject to unreliability from contamination since they are generally placed outside the vacuum envelope. Correction of aberrations is also well-understood and well-developed at the present time. However, electromagnetic deflection yokes present a very large inductive load which must be driven with high current.

Of course, image errors are cumulative and effects of undershoot, overshoot and ringing must be held to a small fraction of the resolution of the overall electron beam exposure system. By the same token, recent improvements in resolution have greatly increased the accuracy with which beam deflection must be accomplished. Accordingly, it can be readily understood that previously adequate deflection driver circuits must necessarily compromise image fidelity (by introducing deflection errors comparable to or larger than the resolution of the system) or throughput (by increasing the time required to step and settle).

A complicating factor in design of drivers for inductive loads is that amplifier circuits therein can easily become saturated. High accuracy is generally achieved through feedback and rapid change of input signal can cause large error signals that can drive amplifier output to substantially the power supply voltage at which some latching effects are observed. Transients and ringing can persist for many microseconds as the servo or feedback loop regains stability after a hard saturation.

Another complicating factor is drift of amplifier or drive circuit output with temperature. Since currents in yokes of electromagnetic deflection systems are large, temperature excursions will be substantial. Since the response of an amplifier (or any other active semiconductor device) to a given input signal will change significantly with temperature, feedback arrangements are generally subject to drift since the error signal will differ from the signal necessary to obtain the required output response and additional corrective circuitry must be provided to compensate for thermal drift. Of course, such corrective circuitry increases complexity and cost and correction to accuracies now required may not be practical.

Additionally, the resistive component of the load impedance may drift with temperature as is particularly likely in charged particle beam deflection systems where coil current is very high. The driver must also provide compensation for this change in impedance such that the current in the inductive load is not altered significantly from the intended levels. As with thermal drift of the driver circuit, such compensation requires additional complexity and cost and is complicated by the possibility of thermal drift discussed above.

Accordingly, it is seen that known driver circuits for reactive loads cannot provide the accuracy of output required for driving electromagnetic charged particle beam deflection yokes with the required accuracy at the required deflection speeds and require a trade-off between these operating parameters. Further, compensation for thermal drift to accuracies now required may not be possible, particularly in a manner consistent with simultaneous requirements for deflection accuracy and speed.

SUMMARY OF THE INVENTION

It is therefore an object of the present invention to provide a driver circuit for large reactive (e.g. inductive) loads which achieves an accuracy of better than a very few parts per million in response to inputs which can change very rapidly.

It is another object of the invention to provide a driver circuit for large reactive loads which can maintain thermal drift within the limits of accuracy of a very few parts per million.

It is a further object of the invention to provide a driver circuit for large reactive loads which can be adjusted to achieve critical damping to reduce undershoot, overshoot and ringing to negligible levels within extremely short periods of time.

In order to accomplish these and other objects of the invention, a circuit for driving an inductive load is provided comprising a first amplifier and a second amplifier connected in cascade, said second amplifier being subject to offset drift with temperature variation, open loop gain of the first amplifier being much greater than a gain of the second amplifier, an arrangement for sensing an output of the second amplifier and providing a feedback signal to an input of the first amplifier, and an arrangement for thermally isolating or regulating temperature of the first amplifier.

BRIEF DESCRIPTION OF THE DRAWINGS

The foregoing and other objects, aspect and advantages will be better understood from the following detailed description of a preferred embodiment of the invention with reference to the drawings, in which.

DETAILED DESCRIPTION OF A PREFERRED EMBODIMENT OF THE INVENTION

Figure 1:
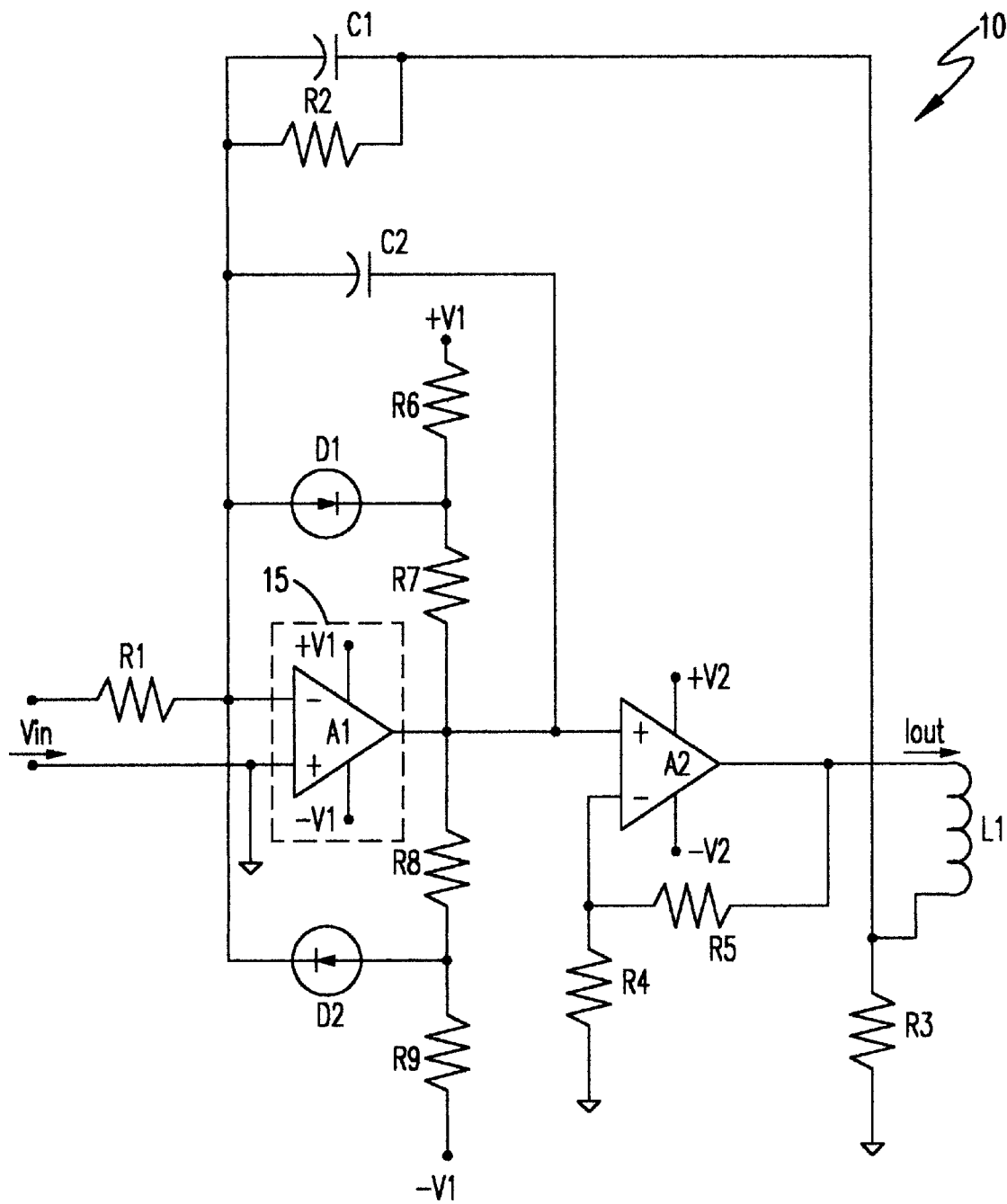
FIG. 1 is a schematic diagram of a driver circuit in accordance with a preferred embodiment of the invention.

Referring now to the drawings, and more particularly to FIG. 1, there is shown a schematic diagram of a preferred embodiment of a driver circuit 10 in accordance with the invention. This circuit is intended to deliver a current through coil L1 which is proportional to an analog input voltage Vin with a very high accuracy within a very few parts per million. Precisely controlling the current through coil L1 has many useful applications, for example, voice coils of mechanical positioning systems and deflection yokes of charged particle beam systems. For convenience and as reflecting the preferred environment, the invention will be discussed in terms of its application to a deflection yoke of an electron beam lithography tool. However, it is to be understood that the applicability of the invention is not so limited.

The circuit of FIG. 1 includes two cascaded amplifiers A1 and A2 with the output of amplifier A2 being applied to the inductive load represented by coil L1. The current through coil L1 also passes through precision sense resistor R3 which is designed to have a small resistance value and minimal resistance value drift with temperature (e.g. a precision, temperature-stabilized resistor). However, to further increase accuracy of current measurement, it is preferred that R3 be liquid cooled. A small amount of the current (limited by the value of R2) is fed back to the negative input of amplifier A1 which is a virtual ground summing junction. This does not introduce any error as long as R2 is chosen to have the same low noise and stability characteristics as R3. Therefore, the voltage across R1 will be very accurately proportional to the current through L1.

Amplifiers A1 and A2 cascade their gain to amplify the voltage at negative input of amplifier A1, connected to Vin through resistor R1. The amplified voltage is applied to coil L1 such that the resulting current causes the voltage across R3 to equal Vin. Essentially, the amplifiers A1 and A2 and the feedback loop through R2 of the voltage across current sensing resistor R3 form a closed loop servo system that strives to make the current through L1 proportional to the voltage applied at Vin. The DC transfer function or closed loop gain of this servo system is thus $I_{L1}=(R2*Vin)/(R1*R3)$. When R1=R2, the transfer function simplifies to $I_{L1}=Vin/R3$. While the gain of amplifiers A1 and A2 is cascaded and only a single feedback loop including both amplifiers is provided, a minimum of two amplifiers is considered to be necessary to the practice of the invention.

First, amplifier A2 may be required to dissipate a substantial amount of heat to achieve the desired deflection or positioning range. Therefore the temperature of amplifier A2 may change considerably. The gain of amplifier A2 is small (approximately the ratio of the power supply voltages, V1/V2) compared to the nominal pre-set gain (without clamping, as will be discussed below) of amplifier A1 and is determined by resistors R4 and R5 in as Gain=(1+(R4/R5)). The input offset drift with temperature of A2 will change as A2 changes temperature and the offset drift and input noise of A2 will be multiplied by its relatively small gain. Since the noise and offset error are within the servo loop of the A1 and A2 cascade, the noise and error can be corrected by the larger servo loop gain of amplifier A1. Since amplifier A1 is provided separately from A2, it can be thermally isolated and separately cooled/regulated in temperature (as depicted by dashed line 15) so that the offset drift of amplifier A1 can be minimized to avoid complication of correction of the drift and noise of A2.

Second, separate amplifiers allow separate power supplies to be used. Amplifier A1 can have conventional power supply voltages +V1 and −V1 applied thereto while amplifier A2 is preferably of a type which can handle much higher voltages +V2 and −V2 which are sufficient to produce desired current levels in coil L1 which with have a significant resistance and, as an inductor, produce voltages which will oppose a change in current and which must be overcome by the output voltage swing of A2. This voltage which is developed by L1 is called back EMF which equals Ldi/dt. Thus the back EMF voltage can become quite large for rapid changes in current.

Third, amplifiers designed to withstand high voltages and high currents are generally associated with relatively poor noise and offset drift specifications. Amplifier A1, however, can be selected to have good/low offset drift and noise specifications since it is provided with a power supply providing more conventional voltages. Further, amplifier A1 can be chosen to have modest output drive capability since it need only drive the high impedance positive input of amplifier A2 and the clamping circuit which will be discussed below. The modest drive capability and requirements of amplifier A1 assists in minimizing generation of heat and maintaining a substantially constant temperature thereof to minimize offset drift.

A further feature of the preferred drive circuit of FIG. 1 is the clamping feedback circuits connected to amplifier A1 which prevents either A1 or A2 going into hard saturation. It should be appreciated that while the gain of amplifier A2 is kept low, preferably in the range of 5–10, the gain of amplifier A1 could exceed one million. Thus the cascade gain of amplifiers A1 and A2 could exceed ten million.

Thus, in the absence of such clamping circuits, when a step voltage waveform is applied to Vin, amplifiers A1 and A2 can easily be driven to the limit of their respective power supply voltages in an effort to produce a step increase in current in coil L1. Since several microseconds may be required for the current in L1 to reach the desired value, amplifiers A1 and A2 could be at their limits for a considerably longer period of time and a transient error voltage could develop at the negative/inverting input of A1 to send it into hard saturation, after which transient and ringing may persist for many microsecond or milliseconds while saturation effects in the transistors of the amplifiers are overcome and the servo loop regains stability.

A clamping network preferably comprising resistors R6 and R7 and diode D1 prevents amplifier A1 being driven into hard saturation on positive input voltages (corresponding to negative output voltages) since R6 and R7 are chosen such that diode D1 will be forward biased when the junction node of D1, R6 and R7 starts to go more negative than about 0.7 volts relative to the virtual ground at the inverting input to A1. When D1 is conducting, the nominal gain of amplifier A1 will drop from in excess of one million to the ratio of R7 to R1 (R7/R1) which could be less than one, preventing drive into hard saturation and effectively clamping the output of A1 to −10 volts referenced to the virtual ground input to A1. While the reduction in gain of amplifier A1 below that of A2 would ordinarily prevent correction for drift or noise, there is no need for such correction while the amplifier inputs and outputs are clamped. In other words, the clamping network limits the amplifiers to their optimal performance and transient response while avoiding hard saturation.

The clamping network preferably comprising resistors R8 and R9 and diode D2 performs a similar function for positive output voltages of amplifier A1. Accordingly, the output voltage of amplifier A2 will be limited by the input voltage swing, preferably to a few volts less than the power supply voltages of +V2 and −V2 by appropriately choosing the values of R5 and R6 to limit gain of amplifier A2 so that it cannot be driven into hard saturation within limits of the input voltage swing imposed by the A1 clamping network. The values of C1 and C2 are trimmed to produce critical damping and fastest step response and settling time, as will be discussed in greater detail below.

In view of the foregoing, it is readily apparent that the driver circuit in accordance with the invention can provide a voltage to current conversion for driving an inductive load such that drift and noise of a high voltage, high current amplifier can be corrected to a proportionality error of a very few parts per million and hard saturation due to large input voltage steps and the transient errors and ringing resulting therefrom can be avoided. Accuracy of drift and noise correction are simplified and large temperature excursions of the high-voltage, high-current amplifier can thus be tolerated by using two power supplies and a thermally isolated and/or regulated high gain, low noise amplifier to provide most of the circuit gain.

Figure 2:
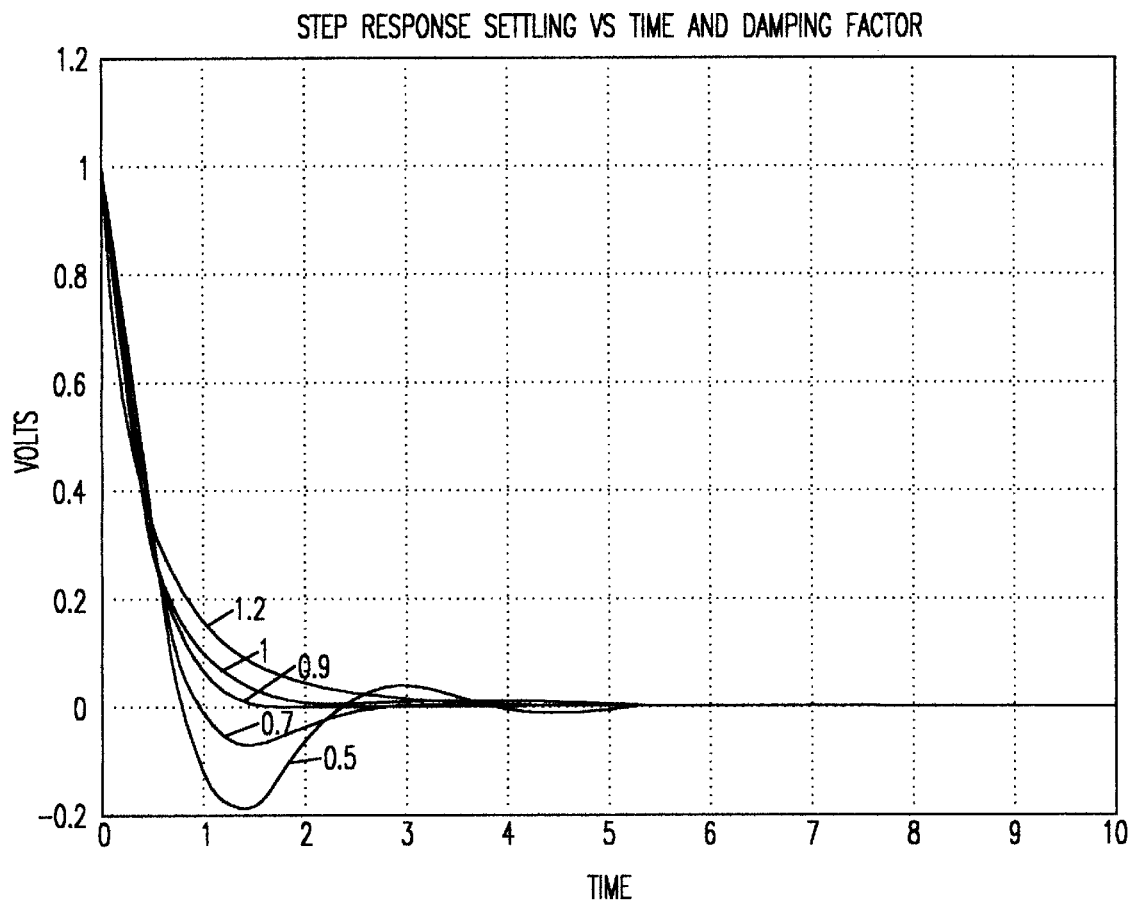
FIGS. 2 and 3 are graphs useful for conveying an understanding of the importance of critical damping in the circuit of FIG. 1.

Referring now to FIG. 2, it is well-understood in the automatic control or servo systems art that response of a feedback system cannot be instantaneous. Therefore, response to a step function input will not be ideal and any feedback circuit will exhibit an undamped natural frequency and a damping factor characterizing the closed loop response. That is, if the output approaches the desired value too quickly due to excessive gain applied to the error signal, overshoot and ringing effects will be observed. This condition is referred to as being underdamped where the damping factor is less than one. Conversely, if the gain applied to the error signal is too low, the time required for the output to come arbitrarily close to the desired voltage will be extended. This condition where the damping factor exceeds one is referred to as being overdamped. Optimum response time will be obtained when the circuit has a damping factor of one; a condition referred to as critically damped second order response.

Figure 3:
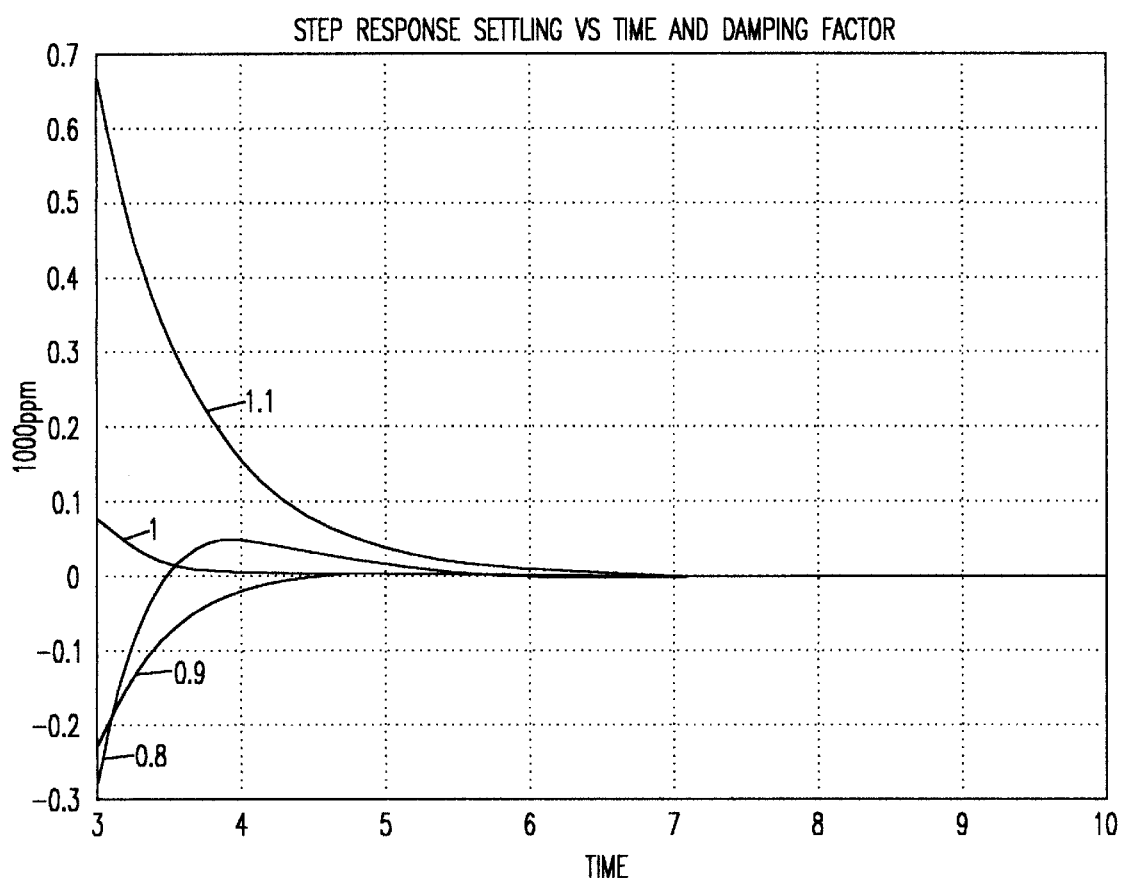

The response to a step input function for these conditions are illustrated in FIGS. 2 and 3 for different exemplary damping factors (with an arbitrary time scale common to both FIGS. 2 and 3). FIG. 2 shows a complete response to a step input for dampoing dfactors of 0.5, 0.7, 0.9, 1.0 and 1.2 while FIG. 3 shows an enlarged portion thereof for a smaller range of damping factors (0.8, 0.9, 1.0 and 1.1) starting significantly after the step input and after underdamped responses have overshot the desired output value. Note that the settling time required for even a 20% underdamped system is shorter than the settling time of a 10% overdamped system and that the settling time for a 10% underdamped system is roughly twice that of a critically damped system. Therefore, damping factor is very important to minimization of settling time and performance of the driver circuit.

Another feature of the present invention is that the step response of the voltage to current transfer function can be optimized to that of a critically damped second order system. That is, a complex zero is formed by R2 and capacitor C1 in the feedback loop which can be adjusted to exactly cancel the complex pole formed by the inductance of L1 and the sensing resistance R3. Capacitor C2 is an adjustable capacitor which affects overall loop gain of the system and facilitates setting the loop to the critical damping point. This feature allows the frequency and phase response of the closed loop transfer function to be extended to a frequency which is at least thirty times higher than the frequency corresponding to the L1/R3 time constant. Since the closed loop system is a second order system that is critically damped, the residual error will exponentially approach zero in about half the time required in a single order system.

In view of the foregoing, it is seen that the driver circuit in accordance with the invention provides greatly enhanced performance in both accuracy and speed of response in conversion of an input voltage signal to a current in a connected inductive load. Offset drift with temperature variation and noise associated with high voltage, high current amplifiers is fully corrected by using a thermally isolated input signal amplifier with greater gain. Hard saturation associated with rapid changes in input voltage is avoided by a clamping network and the system may be adjusted to perform as a critically damped second order system to prevent ringing and increase response speed and minimize settling time. The proportionality of the voltage to current conversion is accurate to a very few parts per million and does not limit exposure fidelity and supports current and foreseeable positioning and electron beam location resolution.

While the invention has been described in terms of a single preferred embodiment, those skilled in the art will recognize that the invention can be practiced with modification within the spirit and scope of the appended claims.

We claim:

1. A circuit for driving an inductive load comprising
a first amplifier and a second amplifier connected in cascade, said second amplifier being subject to offset drift with temperature variation, open loop gain of said first amplifier being greater than a gain of said second amplifier,
means for sensing an output of said second amplifier and providing a feedback signal to an input of said first amplifier, and
means for thermally isolating or regulating temperature of said first amplifier.

2. A circuit as recited in claim 1, further including a clamping network connected to said first amplifier.

3. A circuit as recited in claim 1, wherein separate power supplies are provided for said first amplifier and said second amplifier.

4. A circuit as recited in claim 2, wherein separate power supplies are provided for said first amplifier and said second amplifier.

5. A circuit as recited in claim 4, wherein said clamping circuit is referenced to a power supply provided for said first amplifier.

6. A circuit as recited in claim 2, wherein said clamping network prevents hard saturation of said second amplifier.

7. A circuit as recited in claim 1, further including means forming a feedback path from an output of said first amplifier to an input of said first amplifier.

8. A circuit as recited in claim 7, wherein said means forming a feedback path from an output of said first amplifier to an input of said first amplifier is adjustable to achieve critical damping of said circuit.

9. A circuit as recited in claim 1, further including means for cancelling a complex pole corresponding to said inductive load and said means for sensing an output of said second amplifier, and means for adjusting overall loop gain of said circuit and extending frequency and phase response of the closed loop transfer function of said circuit above a frequency corresponding to a time constant of said inductive load and said means for sensing an output of said second amplifier.

10. A circuit as recited in claim 9, wherein said means for sensing an output and providing a feedback signal includes said means for cancelling said complex pole.

11. A circuit as recited in claim 10, wherein said means for adjusting overall loop gain is included in a feedback path from an output of said first amplifier to an input of said first amplifier.

12. A circuit as recited in claim 11, wherein said means for adjusting overall loop gain is an adjustable capacitor.

13. A circuit as recited in claim 1, wherein said means for sensing said output of said second amplifier comprises a precision, temperature-stabilized resistor.

14. A circuit as recited in claim 13, wherein said resistor is liquid-cooled.

\* \* \* \* \*